United States Patent
Arberet et al.

(10) Patent No.: US 12,205,279 B2
(45) Date of Patent: Jan. 21, 2025

(54) MACHINE LEARNING FOR MEDICAL IMAGE RECONSTRUCTION WITH PHASE CORRECTION

(71) Applicant: Siemens Healthineers AG, Forchheim (DE)

(72) Inventors: Simon Arberet, Princeton, NJ (US); Marcel Dominik Nickel, Herzogenaurach (DE); Thomas Benkert, Neunkirchen am Brand (DE); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 345 days.

(21) Appl. No.: 17/655,220

(22) Filed: Mar. 17, 2022

(65) Prior Publication Data

US 2023/0298162 A1   Sep. 21, 2023

(51) Int. Cl.
*G06T 7/00* (2017.01)
*G06T 5/20* (2006.01)
(Continued)

(52) U.S. Cl.
CPC .............. *G06T 7/0012* (2013.01); *G06T 5/20* (2013.01); *G06T 5/50* (2013.01); *G06T 7/38* (2017.01);
(Continued)

(58) Field of Classification Search
CPC G06T 7/0012; G06T 5/20; G06T 5/50; G06T 7/38; G06T 2207/10088;
(Continued)

(56) References Cited

U.S. PATENT DOCUMENTS 6,466,016 B1 * 10/2002 Miyoshi ............... G01R 33/565
324/309
10,460,440 B2 * 10/2019 Zhang ................... G06T 7/0012
(Continued)

OTHER PUBLICATIONS

Alexander, Loktyushin, et al. "Learning-based solution to phase error correction in T2*-weighted GRE scans." (2018) (Year: 2018).*

(Continued)

*Primary Examiner* — Aaron W Carter
*Assistant Examiner* — Courtney Joan Nelson

(57) ABSTRACT

For reconstruction in medical imaging using phase correction, a machine learning model is trained for reconstruction of an image. The reconstruction may be for a sequence without repetitions or may be for a sequence with repetitions. Where repetitions are used, rather than using just a loss for that repetition in training, the loss based on an aggregation of images reconstructed from multiple repetitions may used to train the machine learning model. In either approach, a phase correction is applied in machine training. A phase map is extracted from output of the model in training or extracted from the ground truth of the training data. The phase correction, based on the phase map, is applied to the ground truth and/or the output of the model in training. The resulting machine-learned model may better reconstruct an image as a result of having been trained using phase correction.

17 Claims, 4 Drawing Sheets

(51) Int. Cl.
  *G06T 5/50* (2006.01)
  *G06T 7/38* (2017.01)
  *G06V 10/44* (2022.01)
  *G06V 10/82* (2022.01)

(52) U.S. Cl.
  CPC ............ *G06V 10/443* (2022.01); *G06V 10/82* (2022.01); *G06T 2207/10088* (2013.01); *G06T 2207/20081* (2013.01); *G06T 2207/20084* (2013.01)

(58) Field of Classification Search
  CPC . G06T 2207/20081; G06T 2207/20084; G06T 7/20; G06T 5/60; G06T 2207/30048; G06T 2210/41; G06T 2207/30004; G06T 2211/441; G06T 11/003; G06V 10/443; G06V 10/82; G06V 10/454; G06V 10/44; G06V 2201/03; G01R 33/5608; G01R 33/56316; G01R 33/5676; G16H 30/40; G16H 30/20; G16H 50/20; G06N 3/045; G06N 3/08; G06N 3/09; G06N 3/088; G06N 3/0464; G06N 3/02; G06N 20/00; A61B 5/055; A61B 5/0044; A61B 5/0013; A61B 5/7203; A61B 5/7207; A61B 2090/374; A61B 5/7292; A61B 5/7289; A61B 8/483
  See application file for complete search history.

(56) References Cited

U.S. PATENT DOCUMENTS 10,996,306 B2 * 5/2021 Heukensfeldt Jansen ................... G06V 10/993
2022/0026516 A1 * 1/2022 Guidon ................ G01R 33/565

OTHER PUBLICATIONS

Aittala, Miika, and Frédo Durand. "Burst image deblurring using permutation invariant convolutional neural networks." Proceedings of the European Conference on Computer Vision (ECCV). 2018. pp. 1-17.

Wagstaff, Edward, et al. "On the limitations of representing functions on sets." International Conference on Machine Learning. PMLR, 2019. pp. 1-14.

Zaheer, Manzil, et al. "Deep sets." arXiv preprint arXiv:1703.06114 (Apr. 2018). pp. 1-29.

Pizzolato, Marco, et al. "Adaptive phase correction of diffusion-weighted images." NeuroImage 206 (2020): 116274.

Wikipedia "Two-dimensional window design" Retrieved Mar. 9, 2022. pp. 1-4. https://en.wikipedia.org/wiki/Two-dimensional_window_design.

U.S. Appl. No. 17/473,206, filed Sep. 13, 2021.

* cited by examiner

MACHINE LEARNING FOR MEDICAL IMAGE RECONSTRUCTION WITH PHASE CORRECTION

FIELD

This disclosure relates to medical image reconstruction, such as reconstruction in magnetic resonance (MR) imaging.

BACKGROUND

Some medical imaging uses reconstruction from the scan data to estimate an image or real-space object from measurements. For example, magnetic resonance (MR), computed tomography (CT), positron emission tomography (PET), or single photon emission computed tomography (SPECT) reconstruct from a measurement domain to an object domain.

Some MR acquisition sequences or applications suffer from low signal-to-noise ratio (SNR). A typical example is diffusion weighted imaging (DWI). This especially holds true for high b-values. In order to increase SNR, multiple repetitions of the same scan can be acquired and averaged. However, the phase maps of the different complex-valued repetitions vary significantly (e.g., due to their sensitivity to motion). Thus, averaging of complex-valued data may result in phase singularities, signal dropouts, etc. To circumvent this problem, the magnitude images of the repetitions are averaged. In order to enable complex-valued averaging, an additional phase correction would be used on each repetition.

The typical MR scenario (e.g., sequence or application) does not use averaging. However, without averaging, the redundancy of the multiple repetitions is not exploited in order to decrease the noise level. Also, typical loss functions for machine-learned MR reconstruction models do not consider the noise in the target, such that the reconstruction tends to produce slightly blurred results.

SUMMARY

By way of introduction, the preferred embodiments described below include methods, systems, instructions, and computer readable media for reconstruction in medical imaging using phase correction. A machine learning model is trained for reconstruction of an image. The reconstruction may be for a sequence without repetitions or may be for a sequence with repetitions. Where repetitions are used, rather than using just a loss for that repetition in training, the loss based on an aggregation of images reconstructed from multiple repetitions may used to train the machine learning model. In either approach, a phase correction is applied in machine training. A phase map is extracted from output of the model in training or extracted from the ground truth of the training data. The phase correction, based on the phase map, is applied to the ground truth and/or the output of the model in training. The resulting machine-learned model may better reconstruct an image as a result of having been trained using phase correction.

In a first aspect, a method of machine training for MR reconstruction in medical imaging is provided. MR training data including ground truth representations is acquired. A neural network is machine trained for the MR reconstruction using the MR training data. An output of the neural network and/or the ground truth representations are phase corrected in the machine training. The neural network as machine-trained is stored.

In one embodiment, the MR training data is for an MR protocol using multiple repetitions. The machine training trains the neural network to output an image for each one of the multiple repetitions. A first loss used in the training is based on an aggregation of the images from the multiple repetitions. An example integration of the phase correction in this repetition approach applies the phase correction to each of the ground truth representations. The first loss used in the training is based on the aggregation of the images as compared to an aggregation of the ground truth representations for the repetitions. The aggregation of the ground truth representations is formed after the phase correction is applied. As another example, the aggregation is an average in a complex-value domain where the first loss is a combination of a complex-value loss and a magnitude-based loss.

In other embodiments, a phase map is extracted from low pass filtering of the output or one of the ground truth representations. The phase correction multiplies complex values with the phase map. In one approach, separate ones of the phase maps are separately extracted for each of the outputs or ground truth representations.

The phase correction is derived from the MR training data or the output of the neural network. The phase correction is applied to the output of the neural network in training and/or to the ground truth representations used in training.

In an embodiment, the machine training is with a complex-value loss based on the phase corrected output and/or ground truth representations and a supervised loss between the output and the ground truth representations without phase correction. Other combinations of losses may be used.

In a second aspect, a method is provided for reconstruction of a medical image in a medical imaging system. The medical imaging system scans a patient. The scan results in scan data. An image processor reconstructs a scan image by applying a machine-learned model. The machine-learned model was trained with application of phase correction. The medical image based on the scan image is displayed.

In one embodiment, the scan data is measurements over a series of scans of an imaging protocol. The scan image is reconstructed for each of the scans of the series. The machine-learned model was trained for use for each scan of the imaging protocol based on a loss function from a combination of training images from different scans for the imaging protocol. The scan images are combined into the medical image. In a further embodiment, the phase correction was separately calculated for each ground truth image for each of the scans of the imaging protocol. An averaged ground truth was generated from the phase corrected ground truths and applied for a complex-valued loss. In yet a further embodiment, the phase correction was separately applied to each output of the model being trained, and the complex-valued loss was based on an average of the phase corrected outputs and the average of the phase corrected ground truths.

In a third aspect, a system is provided for reconstruction in medical imaging. A medical scanner is configured to repetitively scan a region of a patient pursuant to a protocol. The scan provides scan data in repetitions of the protocol. An image processor is configured to reconstruct, for each of the repetitions, a representation of the region. The image processor is configured to reconstruct by application of a machine-learned model having been trained for the reconstruction for each of the repetitions based on a loss function between an aggregate of outputs from the repetitions of the protocol and a ground truth. The loss function is a complex-valued loss based on the output for each of the repetitions and component images of the ground truth being phase corrected. The image processor is further configured to combine the representations from the repetitions. A display is configured to display an image of the region from the combined representations.

In one embodiment, the machine-learned model was trained with the phase corrections for the outputs having been derived from the component images of the ground truth. As a further embodiment, the machine-learned model was trained with the phase corrections having been derived from the component images by low pass filtering and extraction from results of the low pass filtering. As another embodiment, the outputs and component images were paired such that the phase correction for each component image is applied to the paired output.

In another embodiment, the ground truth is an aggregated ground truth.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

In order to create good quality target or ground truth (e.g., better SNR) for training a deep learning network in reconstruction, repetition averaging or another aggregation across repetitions for calculating the loss may be used. U.S. Patent Application US 2023-0085254, filed Sep. 13, 2021, the disclosure of which is incorporated herein by reference for the various embodiments, teaches this approach. This aggregation can be done on both: 1) the network predictions during training or optimization and 2) the target or ground truth during training or optimization. Alternatively, it is also possible to average only on the target to train the network to reconstruct the high SNR target from a single repetition.

The aggregation is performed on the magnitude. The problem of averaging on the magnitude is that, while the noise typically has a centered distribution in the complex-value domain, its magnitude averaging is positive. Thus, if used as a target in the training, the network learns to produce predictions with positive noise bias. As a consequence, the resulting images have a positive noise bias, which is not desirable.

In order to reduce or remove positive noise bias, a phase correction is computed and applied on each individual target of each repetition and/or the network prediction(s). The phase correction is applied in training and before complex-value averaging or other combination used for the loss calculation.

While the examples herein apply the phase correction for training for MR reconstruction, the phase correction may be applied in other types of medical image reconstruction, such as PET, SPECT, or CT. The examples herein are mostly in the context of aggregation across repetitions, such as for DWI. In alternative embodiments (e.g., baseline approach), the phase correction is used for a loss without aggregation, such as for a loss calculated for each repetition, separately by repetition, and/or for an imaging protocol that does not use repetition.

Figure 1:
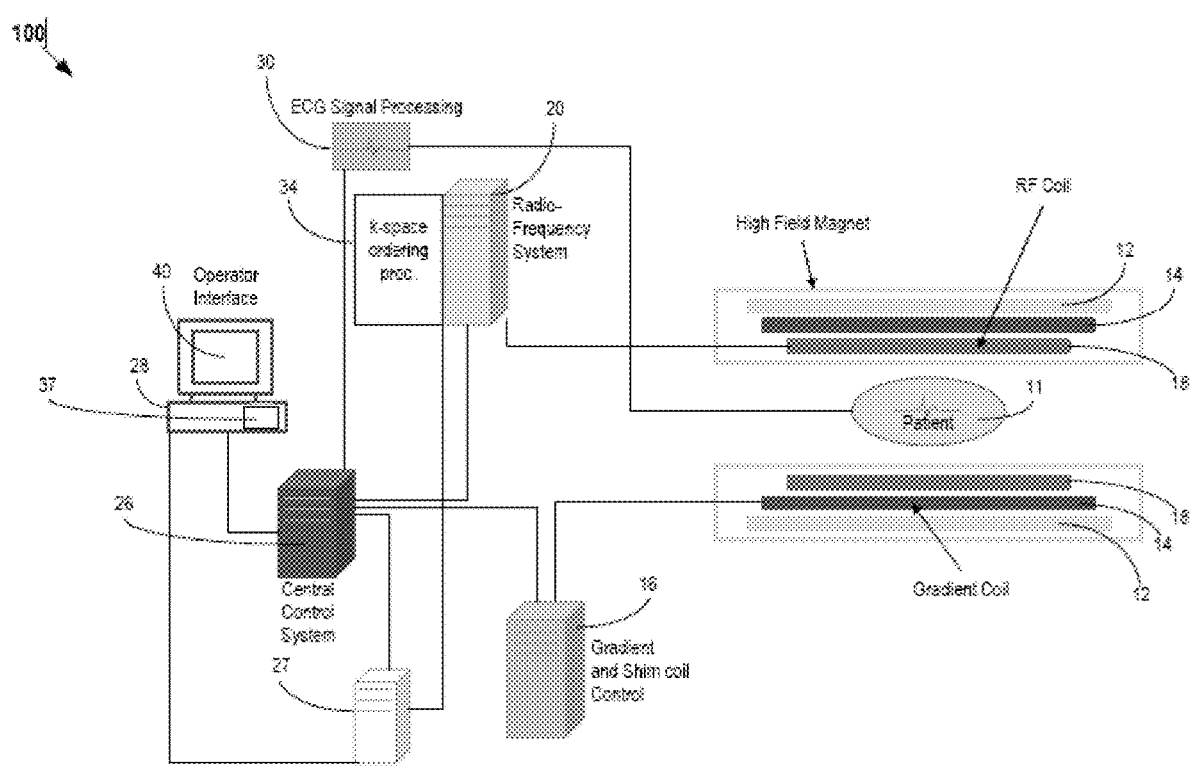
FIG. 1 is a block diagram of an embodiment of an MR system for medical imaging with a machine-learned model trained with phase correction.

FIG. 1 shows one embodiment of a system for reconstruction in medical imaging. The system scans a given patient, such as using a protocol creating repetitions of scan data having redundant information. The system applies a machine-learned model in reconstruction, such as where the model is applied for different groups of scan data (e.g., each repetition) separately but was trained using a loss based on aggregation across groups. The machine-learned model, to avoid positive noise bias, was trained with a phase correction applied to the ground truth and/or inferred representations from the model being trained.

The example used herein is in a MR context (i.e., a MR scanner), but the scanning protocols and corresponding types of scanners may be used in reconstruction for CT, PET, SPECT, or other medical imaging.

The system uses a machine-learned model in reconstruction. The machine-learned model is formed from one or more networks and/or another machine-learned architecture (e.g., support vector machine). For example, and used herein, the machine-learned model is a deep-learned neural network. The machine-learned model is used for at least part of the reconstruction, such as regularization of reconstruction. In regularization, image or object domain data is input, and image or object domain data with less artifact is output. The remaining portions or stages of the reconstruction (e.g., Fourier transform and gradients in iterative optimization) are performed using reconstruction algorithms and/or other machine-learned networks. In other embodiments, the machine-learned model with a loss based on aggregation is used for all the reconstruction operations (one model to input k-space data and output regularized image data) or other reconstruction operations (e.g., used for transform, gradient operation, and/or regularization). The reconstruction is of an object or image domain from projections or measurements in another domain, and the machine-learned model trained using phase correction is used for at least part of the reconstruction.

The system is implemented by an MR scanner or system, a computer based on data obtained by MR scanning, a server, or another processor. MR scanning system 100 is only exemplary, and a variety of MR scanning systems can be used to collect the MR data. In the embodiment of FIG. 1, the system is or includes the MR scanner or MR system 100. The MR scanner 100 is configured to scan a patient. The scan provides scan data in a scan domain. The MR scanner 100 scans a patient to provide k-space measurements (measurements in the frequency domain). In a given scan or examination (e.g., imaging appointment), the patient is scanned once for a protocol or multiple times as part of a protocol providing repetitions or groups of at least partly redundant information.

Magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil controller 16, produce position dependent and shimmed magnetic field gradients in three orthogonal directions and generate magnetic field pulse sequences.

RF (radio frequency) module 20 provides RF pulse signals to RF coil 18, which in response produces magnetic field pulses that rotate the spins of the protons in the imaged body of the patient 11 by ninety degrees, by one hundred and eighty degrees for so-called "spin echo" imaging, or by angles less than or equal to 90 degrees for so-called "gradient echo" imaging. Gradient and shim coil control module 16 in conjunction with RF module 20, as directed by central controller 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor 34 to provide an MR dataset to an image data processor for processing into an image (i.e., for reconstruction in the object domain from the k-space data in the scan domain). In some embodiments, the image data processor is in or is the central controller 26. In other embodiments, such as the one depicted in FIG. 1, the image data processor is in a separate processor 27. ECG synchronization signal generator 30 provides ECG signals used for pulse sequence and imaging synchronization. A two- or three-dimensional k-space storage array of individual data elements in k-space component processor 34 stores corresponding individual frequency components forming an MR dataset. The k-space array of individual data elements has a designated center, and individual data elements individually have a radius to the designated center.

The central controller 26 uses information stored in an internal database to process the detected MR signals in a coordinated manner to generate high quality images of a selected slice(s) of the body (e.g., using the image data processor) and adjusts other parameters of the system 100. The stored information includes a predetermined pulse sequence of an imaging protocol and a magnetic field gradient and strength data as well as data indicating timing, orientation, and spatial volume of gradient magnetic fields to be applied in imaging.

The medical scanner 100 is configured by the imaging protocol to repetitively scan a region of a patient 11. The same patient 11, without leaving the scanner 100, is scanned once or in a repetitive manner providing scan data in repetitions based on the protocol. For example, in MR, such repetition protocols for scanning a patient for a given examination or appointment include diffusion-weighted imaging, turbo-spin-echo imaging, contrast imaging with different echo times, or contrast imaging with different flip angles. Other types of MR or non-MR protocols may use repetition. The sequential or other scanning results in a set of scan data grouped as two or more repetitions or scans. In alternative embodiments, the protocol does not provide for repetition. Scan data representing the patient in one period or instance results from the entire scan.

The central controller 26 (i.e., controller) and/or processor 27 is an image processor that reconstructs a representation of the patient from the k-space data. The image processor is a general processor, digital signal processor, three-dimensional data processor, graphics processing unit, application specific integrated circuit, field programmable gate array, artificial intelligence processor, tensor processor, digital circuit, analog circuit, combinations thereof, or another now known or later developed device for reconstruction. The image processor is a single device, a plurality of devices, or a network. For more than one device, parallel or sequential division of processing may be used. Different devices making up the image processor may perform different functions, such as reconstructing by one device and volume rendering by another device. In one embodiment, the image processor is a control processor or other processor of the MR scanner 100. Other image processors of the MR scanner 100 or external to the MR scanner 100 may be used.

The image processor is configured by software, firmware, and/or hardware to reconstruct. The image processor operates pursuant to instructions stored on a non-transitory medium to perform various acts described herein.

The image processor is configured to reconstruct a representation in an object domain. The object domain is an image space and corresponds to the spatial distribution of the patient. A planar or volume representation is reconstructed as an image representing the patient. For example, pixels values representing tissue in an area or voxel values representing tissue distributed in a volume are generated.

The representation in the object domain is reconstructed from the scan data in the scan domain. The scan data is a set or frame of k-space data from a scan of the patient. The protocol for a scan of a patient may generate multiple such sets or frames of k-space (scan) data. For each repetition, the k-space measurements resulting from the scan sequence are transformed from the frequency domain to the spatial domain in reconstruction. In one approach, reconstruction for a given repetition is an iterative process, such as a minimization problem. In some embodiments, an unrolled iterative reconstruction is provided as a network or model of iteration sequences. A given iteration either in an unrolled network or through a repetition of the reconstruction operations includes a gradient update and regularization. The gradient update compares the current image object with the scan data (e.g., k-space measurements). This comparison uses a system transform to relate the measurements to the image object. Any gradient or comparison relating the image object to the measurements may be used. Regularization is provided in one, some, or all the iterations. Other filtering and/or operations for reconstruction and/or post-reconstruction may be provided. Input bias field correction and/or extrapolation for momentum may be provided as part of the reconstruction. In other embodiments, the reconstruction is performed without iteration.

The image processor is configured to reconstruct, for each of the repetitions, a representation of the region. The reconstruction uses application of a machine-learned model having been trained for the reconstruction for each of the repetitions based on a loss function between an aggregate of outputs from the repetitions of the protocol and a ground truth image. Alternatively, the machine-learned model was trained for each repetition or no repetition based on a loss function for that repetition or instance of scan data and a ground truth image. The training of the machine-learned model results in values for learnable (learned) parameters. By using the loss based on the aggregate image, object, or representation across repetitions to train the machine-learned model for reconstruction of a repetition, different values of the machine-learned model result than if a different loss (e.g., repetition or instance loss without aggregation across repetitions) where used.

The machine-learned model is repetitively used for the repetitions as a function in a deep set. The same machine-learned model is sequentially or in parallel applied in reconstruction for the different repetitions resulting from the imaging protocol. The machine-learned model is used in reconstruction from the scan data of one repetition and used in reconstruction from the scan data of another repetition. While the training used an aggregation across repetitions (e.g., average image from the different repetitions) for loss, the machine-learned model is applied to reconstruct the image for a given one of the repetitions or sub-group of repetitions at a time.

Since the machine-learned model is used for reconstruction of a given or each given repetition, a joint loss may have been used to train. The loss from the aggregation is combined with a loss for one or more repetitions to train. One loss is between the aggregate and the ground truth aggregate or final image, and another loss is between one or more of the representations for one or more of the repetitions and one or more ground truth images for respective one or more repetitions. Any combination of the two losses may be used, such as a weighted average. Alternatively, the other loss is used without the aggregate loss.

The image processor is configured to reconstruct the representation (e.g., image or object) for each repetition. The machine-learned model is used for one, some, or each reconstruction from respective repetitions. The result is a set of reconstructed representations of the same region. The image processor is configured to combine the representations. Any motion correction and/or filtering may be used. The aligned representations are combined to form one representation of the region of the patient. For example, the combination is a sum (e.g., average), a geometric mean, or a geometric product. The diffusion-weighted imaging and turbo-spin-echo imaging protocols sum or average the representations. The contrast protocol may use the geometric mean or product. Other combinations of representations from different repetitions may be used, such as based on the imaging protocol. Alternatively, the reconstructed representation is used to form an image without combination with other representations.

The resulting representation may be a complex or real image. For training, the loss function included a complex-valued loss. The complex-valued loss is subjected to phase correction, such as the output by the model being trained for each of the repetitions and/or component images of the ground truth being phase corrected. Where the loss included an aggregate, the representations from the repetitions (outputs) as phase corrected and/or the ground truths as phase corrected were combined. The outputs from the model during learning and component images of the ground truth were paired. The phase correction extracted from each component image was applied to that component image and the paired output.

The phase correction was multiplication of the complex-valued output or ground truth by a phase map. The phase map was derived or extracted from the ground truth, such as extracting a separate phase map for each of the component images of the ground truth (i.e., separate phase map for each repetition). Any phase map extraction may have been used, such as deriving the phase corrections from the component ground truth images by low pass filtering and extraction of the phase map from results of the low pass filtering.

By having used the phase correction in the training of the model, the model as trained more likely generates an output without or with less positive noise bias. The values of the learnable parameters of the model were set or learned in a way that the resulting values provide a more accurate reconstruction during application for a given patient.

The output image or reconstruction is the reconstructed image. The output image represents the patient (i.e., a reconstructed representation). The image processor may be configured to generate an MR image from a combined representation of outputs for multiple repetitions or from a single output or representation. Where the representation is of an area, the values of the representation may be mapped to display values (e.g., scalar values to display color values) and/or reformatted (e.g., interpolated to a display pixel grid). Alternatively, the output representation is of display values in the display format. Where the representation is of a volume, the image processor performs volume or surface rendering to render a two-dimensional image from the voxels of the volume. This two-dimensional image may be mapped and/or formatted for display as an MR image. Any MR image generation may be used so that the image represents the measured MR response from the patient. The image represents a region of the patient.

A generated image of the reconstructed representation (e.g., combined representation) for a given patient is presented on a display 40 of the operator interface. The computer 28 of the operator interface includes a graphical user interface (GUI) enabling user interaction with central controller 26 and enables user modification of magnetic resonance imaging signals in substantially real time. The display processor 37 processes the magnetic resonance signals to provide image representative data for display on display 40, for example.

The display 40 is a CRT, LCD, plasma, projector, printer, or other display device. The display 40 is configured by loading an image to a display plane or buffer. The display 40 is configured to display the reconstructed MR image of the region of the patient, such as from combined representations of multiple repetitions.

Figure 2:
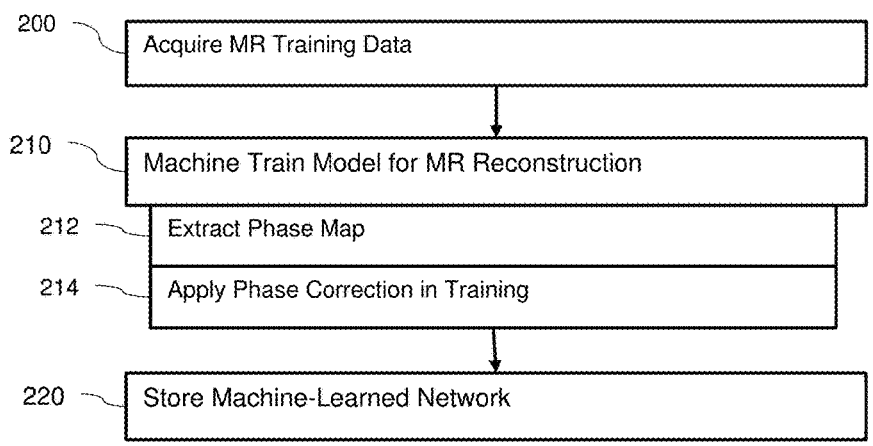
FIG. 2 is a flow chart diagram of one embodiment of a method for machine training for reconstruction using phase correction.

FIG. 2 is a flow chart diagram of one embodiment of a method for machine training for reconstruction in medical imaging, such as training a neural network used in MR reconstruction from signals collected by an MR scanner. The training includes phase correction. Once trained, the machine-learned model may be used with the same learned values in reconstruction of representations for any number of patients from MR scan data for the patients.

The method is implemented by a computer, such as a personal computer, workstation, and/or server. Other computers may be configured to perform the acts of FIG. 2. The MR scanner 100 or central controller 26 may implement the method. In one embodiment, the computer and a database are used to machine train and store the samples and the resulting final trained model. The stored model is then distributed to one or more MR scanners 100 for application using the model as fixed (i.e., the learned values of the variables are not changed for reconstructions for a given patient and/or for different patients).

Figure 6:
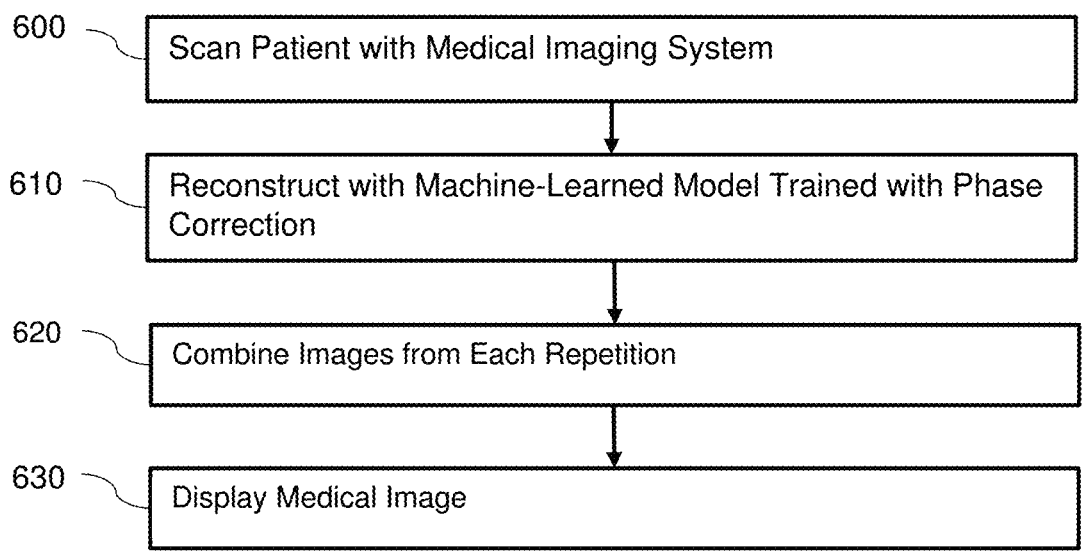
FIG. 6 is a flow chart diagram of one embodiment of a method for reconstruction using a machine-learned network having been trained with phase correction.

The method is performed in the order shown (i.e., top to bottom or numerical) or another order. For example, acts 212 and 214 are performed, at least in part, prior to act 210. Additional, different, or fewer acts may be provided. For example, instead of or in addition to storing in act 220, the machine-learned model is applied to previously unseen scan data for a patient in a reconstruction as shown in FIG. 6.

In act 200, training data is acquired. The training data is acquired from memory, scanning, or transfer. To machine train, training data is created, gathered, or accessed.

The training data includes many sets of data, such as k-space data in sets where each set include multiple repetitions from a same scan sequence. Tens, hundreds, or thousands of sample scan data are acquired, such as from scans of patients, scans of phantoms, simulation of scanning, and/or by image processing to create further samples. Many examples that may result from different scan settings, patient anatomy, scanner characteristics, or other variance that results in different samples in scanning are used. In one embodiment, an already gathered or created MR dataset is used for the training data.

The samples are for scanning following a protocol that uses repetition, such as samples from diffusion-weighted, contrast (e.g., different echo times or flip angles), and/or turbo-spin-echo imaging. Alternatively, the samples are for scanning following a protocol that do not use repetition. Depending on the role in reconstruction of the model to be machine trained, the training data may use k-space data or image domain data for the samples. The samples are used in deep learning to determine the values of the learnable variables (e.g., values for convolution kernels) that produce outputs with minimized cost function across the variance of the different samples.

The training data includes ground truth information. The desired representation or image resulting from a given sample is provided. For example, the final combined image from multiple repetitions without or with reduced artifacts to be output as a final image in reconstruction is provided as ground truth with some or all the samples of input being image or k-space data. As another example, ground truth images for each repetition for each set of repetitions may be provided. These images may be combined to create a ground truth for the aggregation from the different repetitions and/or may be used respectively for losses based on given repetitions (e.g., where a joint loss for repetition and for aggregate is used or where loss without an aggregate loss is used).

In act 210, a computer (e.g., image processor) machine trains a model for reconstruction, such as training for a neural network for regularization, gradient, or k-space to image operations. The neural network is machine trained for MR reconstruction using the training data, including many input samples of sets of scan data repetitions and corresponding ground truth outputs.

In one embodiment, deep learning is used to train the model. The training learns both the features of the input data and the conversion of those features to the desired output (i.e., denoised or regularized image domain data). Backpropagation, RMSprop, ADAM, or another optimization is used in learning the values of the learnable parameters of the network (e.g., the convolutional neural network (CNN) or fully connection network (FCN)). Where the training is supervised, the differences (e.g., L1, L2, mean square error, or other loss) between the estimated output and the ground truth output are minimized.

Any architecture or layer structure for machine learning to perform an operation for reconstruction may be used. For example, a hierarchal and/or iterative architecture to regularize in reconstruction may be used. The architecture defines the structure, learnable parameters, and relationships between parameters. In one embodiment, a convolutional or another neural network is used. Any number of layers and nodes within layers may be used. A DenseNet, U-Net, encoder-decoder, Deep Iterative Down-Up CNN, and/or another network may be used. Some of the network may include dense blocks (i.e., multiple layers in sequence outputting to the next layer as well as the final layer in the dense block). Any know known or later developed neural network may be used. Any number of hidden layers may be provided between the input layer 301 and output layer 303. For iterative reconstruction, the architecture may include an unrolled arrangement of layers or iterative optimization.

The same network is trained to be used for each repetition. Alternatively, a different network is provided for each repetition, whether a different architecture or same architecture but with different values for one or more of the learnable parameters of the network. Different networks are trained for reconstruction for different repetitions. In yet another alternative, a network is trained for reconstruction without using repetitions.

The neural network is trained for MR reconstruction to output an image, such as for each of the multiple repetitions. In response to input scan data of a repetition, the reconstruction outputs an image for that repetition. The network is to be trained to perform some aspect of this repetition-based reconstruction. As a result, an image may be output as an MR reconstruction for each of the multiple repetitions for a given protocol.

Figure 3:
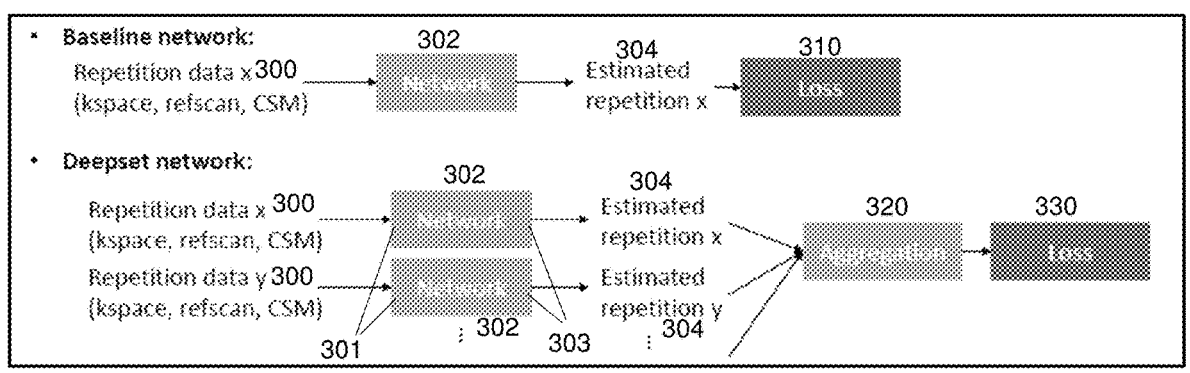
FIG. 3 illustrates example machine training of a network in a baseline approach of repetition-by-repetition and in a deepset approach using aggregation across repetitions.

FIG. 3 shows examples using a baseline approach and a deepset approach. The baseline network 302 is trained to receive scan data 300 for a given repetition (e.g., repetition x) and output a representation 304 in response. The input may include other information, such as a reference scan, coil sensitivity map, and/or clinical measures for the patient. This same network 302 is trained to be applied for each of the repetitions (e.g., repetition y in addition to repetition x where scan data for x and y are acquired as part of a same scan of a same patient pursuant to the protocol).

In one embodiment (the baseline approach), the network 302 is trained to output the image for each of the repetitions independently of the outputs or information for other ones of the repetitions. The scan data for repetition x, without the scan data for other repetitions, is used to reconstruct the image for repetition x. The scan data for repetition y, without the scan data for other repetitions, is used to reconstruct the image for repetition y. The input layer of the network 302 is configured to accept the scan data for a single one of the repetitions to output the image for that single repetition.

The machine training uses a loss to learn the values of the learnable parameters. In the deepset network approach, the loss is based, at least, in part, on an aggregation of the images from multiple repetitions. The training uses a loss function based on deep sets. Since repetition is provided in the protocol, the repetition may be used with the loss for training to reconstruct from a repetition. The repetitions can be sum-decomposable. Based on this, the architecture is designed where each repetition is fed into a neural network φ to provide a repetition reconstruction, then the results of the individual repetition reconstructions are aggregated in some way. The loss function, such as L1, is computed on the aggregated result for optimizing the values of the learnable parameters for the network. The resulting machine training of the neural network for repetition reconstruction preserves invariance by permutation with respect to the multiple repetitions.

FIG. 3 shows an example. Rather than using the baseline, the deepset network arrangement is used in training. The network 302 is applied in reconstruction for each of the repetitions (e.g., x, y, . . . ) of scan data 300, generating estimated images 304 for each of the repetitions (e.g., x, y, . . . ). The images 304 from the different repetitions are combined as the aggregation 320. The loss 330 is then based on this aggregation 320. The loss 330 is a measure of difference between the aggregation 320 of the images and a ground truth image such that the neural network 302 learns for each of the multiple repetitions based on the aggregation 320 across the multiple repetitions.

The aggregation is an average of the images. Other combinations may be used, such as weighted average. In other embodiments, the aggregation is a geometric mean or product, such as for combining images associated with different contrasts. Aggregation can be performed in various ways. Examples are simple averaging of complex or magnitude images or combination of different diffusion directions (e.g., by calculating the geometric of different diffusion directions, known as calculation of "trace-weighted" images).

Using a loss based on the aggregation from the images of different (all or a sub-set) repetitions creates a coupling between the different repetition reconstructions during the training. There is, on the other hand, no coupling during the inference procedure where the trained network is applied for each repetition prior to any aggregation. Each repetition can be reconstructed independently from each other as the acquisition goes on. This can enable a speed-up in the reconstruction (e.g., up to a possible real-time reconstruction) as each image can be reconstructed immediately after the scan data for that repetition has been acquired without having to wait for the completion of the next repetitions and/or the entire scan.

In other embodiments, the loss based on the aggregation across repetitions is part of a joint loss. More than one loss is used in the training. For example, the repetition-specific losses 310 (one for each repetition) is used with the loss 330 based on the aggregation. Any combination of losses may be used. For example, a weighted or simple average of the losses is used. In one embodiment, the relative weight of the individual repetition losses 310 and/or a sum of the repetition losses 310 is weighted equal to or with less weight than the loss 330 based on aggregation.

Other approaches, networks, losses, and/or combinations of losses may be used. For example, the multichannel, global operations to preserve equivariance, other coupling, global pooling, and/or other embodiments taught in U.S. Patent Application US 2023-0085254, filed Sep. 13, 2021, the disclosure of which is incorporated herein by reference, may be used.

Machine learning is an offline training phase where the goal is to identify an optimal set of values of learnable parameters of the model that can be applied to many different inputs. These machine-learned parameters can subsequently be used during clinical operation to reconstruct. Once learned, the machine-learned model is used in an online processing phase in which scan data from multiple repetitions are reconstructed into images. Once trained, the neural network is applied in reconstruction of a representation or image of a patient from a scan of that patient.

Figure 4:
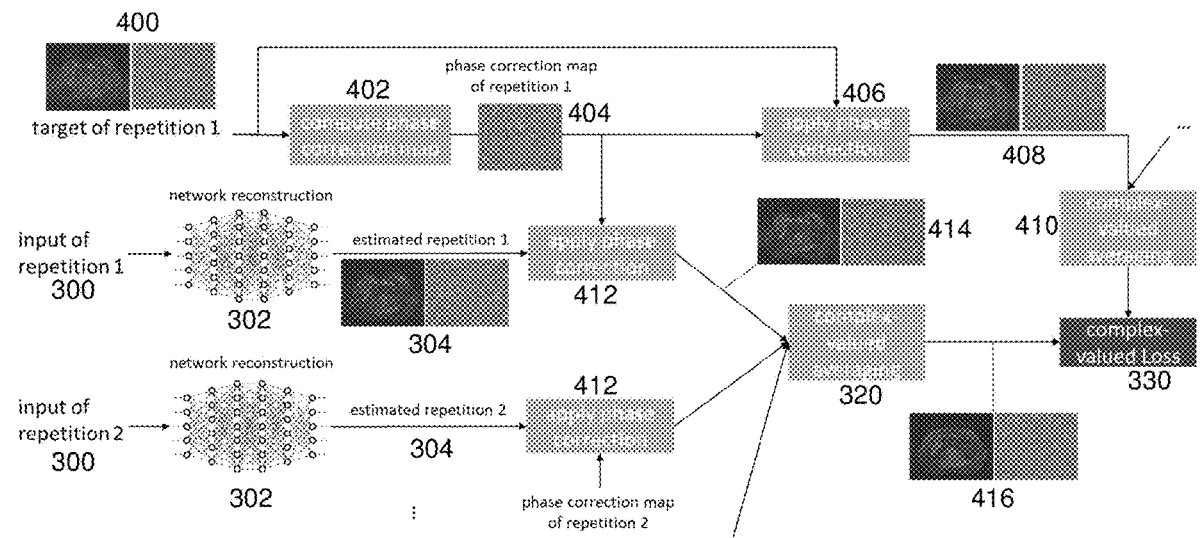
FIG. 4 illustrates example machine training a network using phase correction.

The machine learning includes phase correction. FIG. 4 illustrates use of phase correction in act 214 by applying the phase correction 406 to the ground truth image (e.g., target or other representation) 400, resulting in phase corrected ground truth 408 and/or by applying the phase correction 412 to the output 304 of the network 302 being trained, resulting in phase corrected output 414. This example uses the phase correction 406, 412 where the loss is aggregated, but the phase correction may be used in the baseline approach or non-repetition approaches.

To apply the phase correction in act 214 for the machine learning of act 210, the phase map is extracted in act 212. Referring to FIG. 4, the phase map 404 is extracted or computed in act 402 from the ground truth image or target 400. Separate phase maps 404 are extracted independently for each of the ground truth representations 400.

In the example of FIG. 4, the phase maps 404 are extracted from each ground truth 400. The phase correction is derived from the MR training data (e.g., target 400) during or prior to training and/or from the output 304 of the network 302 during training. For example, a phase correction map 404 is calculated from each repetition target 400. In other embodiments, the phase maps are extracted from each output 304 of the network during training. This alternative approach computes the phase correction directly from the network output 304, but this would add some additional computation during training and slow down the training. Furthermore, the network output 304 would not be constrained by a global phase factor provided by the ground truth 400.

Figure 5:
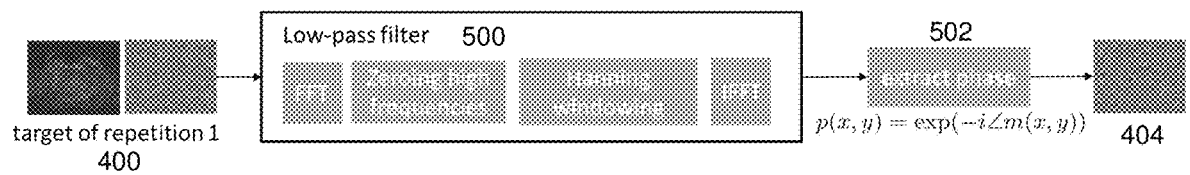
FIG. 5 illustrates example extraction of a phase map for phase correction.

The phase map is extracted in act 212 by low pass filtering of the output 304 or one of the ground truth representations 400. FIG. 5 shows an example embodiment of applying a low-pass filter 500 on the target 400 of a repetition. This low-pass filter 500 can be applied only in the phase encode direction or in all the directions of the image 400. Various low-pass filter arrangements may be used. For example, a fast Fourier transform is applied, high frequencies are zeroed, a windowing is applied (e.g., Hann, Blackman, Hamming, Nuttall, or another type of window) to avoid ringing artefacts, and the results are inverse fast Fourier transformed. The window is one-dimensional if the low pass is applied in only one direction or two or three-dimensional. The low pass filter 500 may be isotropic (windowing applied) or can be from an outer product of 1D windows. Other approaches to extract phase information from the complex valued target 400 may be used.

Once the low-pass filter 500 with windowing has been applied, the phase of the resulting low pass image is extracted in act 502. Any phase extraction may be used, such as using the function represented in FIG. 5. The sign of the extracted phase information is changed to create the phase map 404.

The application in act 214 of the phase correction is an element wise complex-value multiplication between the image 400 and the phase correction map 404. The phase correction multiplies complex values of the target 400 with the phase map.

As noted in FIG. 4, the phase correction extracted from the target in act 212 is applied 406 to the ground truth representation 400, creating the phase corrected ground truth 408 for the repetition. The same phase map 404 is applied 412 to the output of the network 302 generated for that sample linked to the ground truth, resulting in the phase corrected output 414. During the network training, the phase correction map 404 that has been computed from a target 400 of a given repetition is applied 412 on the network prediction 304 corresponding to the same repetition. The phase map 404 for a given repetition is extracted from the ground truth for that repetition and applied to both the ground truth 400 for that repetition and any outputs 304 generated by the network 302 during training for that repetition. In other embodiments, the phase correction is performed just on the ground truth 400 or just on the output 304.

In one embodiment, the phase correction is applied 406 to each of the ground truth representations 400, and the loss 300 used in the training is based on the aggregation (e.g., complex-valued averaging 410) of the images 408 across repetitions. The aggregation of the ground truth representations 408 formed after the phase correction is applied 406 is an average or another combination in a complex-value domain. After applying the phase correction 406 to each individual target repetition, the target repetitions are averaged in the complex-value domain, and this averaged target is used in the loss calculation. In the deepset approach represented in FIGS. 3 and 4, the network outputs 304 after phase correction 412 are averaged or otherwise combined 320 in the complex-values domain, as done for the target combination 410. The loss 330 is then calculated as a complex-value loss or difference between complex values.

Other losses may be used, such as averaging for other losses. For example, other losses based on the aggregates are used. The complex-value loss 330 and a loss from the magnitudes without phase for the aggregates are combined (e.g., weighted average). The magnitude loss may use the target 400 and aggregation of the outputs 304 without phase correction or may be the phase corrected aggregates 320, 410 without phase information.

In an alternative embodiment (e.g., the baseline approach), the network prediction or output 304 after phase correction is directly used in the loss 310. The phase correction is applied to the output 304 for a given repetition or scan. The loss 310 can be complex-value-based and/or a magnitude-based loss. If a magnitude loss is used, however, there is no need to apply the phase correction on the network prediction or output 304. The phase correction is applied to the target or ground truth so that the loss 310 is based on magnitude resulting from phase correction in the ground truth and the output 304 in the magnitude domain.

Losses from the baseline approach and the deepset approach may be used together. The machine training uses a complex-value loss based on the phase corrected output and/or ground truth representations and a supervised loss between the output 304 and the ground truth representations without phase correction. It is possible to mix different types of losses, such as a classical supervised loss between the network prediction and the corresponding target repetition with a loss based-in-part on phase correction.

In act 220 of FIG. 2, the computer or image processor stores the machine-learned model resulting from the machine learning. For example, the network 302 is stored. The matrix or other parameterization of the machine-learned model is saved in memory. After training, the machine-learned model or models are represented as a matrix, filter kernels, and/or architecture with the learned values. The learned convolution kernels, weights, connections, and/or layers of the neural network or networks are provided and stored. The machine-learned model may be stored locally or transferred over a network or by moving the memory to other computers, workstations, and/or MR scanners.

The model resulting from the machine training using the plurality of the samples and phase correction is stored. This stored model has fixed weights or values of learnable parameters determined based on the machine training. These weights or values are not altered by patient-to-patient or over multiple uses for different medical scans. The weights or values are fixed, at least over a number of uses and/or patients. The same weights or values are used for different scans corresponding to different patients and/or different examinations or appointments. The same values or weights may be used by different medical scanners. The fixed machine-learned model or models are to be applied without needing to train as part of the application. Re-training or updated training may be provided.

FIG. 6 is a flow chart diagram of one embodiment of a method for reconstruction of a medical image in a medical imaging system, such as reconstruction of a MR image in an MR system. A machine-learned model as trained is applied for at least part of the reconstruction operation. The model was trained, in part, using phase correction. Once trained, the machine-learned model is used in reconstruction of a spatial representation from input k-space measurements for a patient. The application is part of scanning and reconstruction for patient diagnosis of a given patient for a given examination, scan, and/or appointment. The machine-learned model was previously trained using phase correction with or without a loss based, at least in part, on an aggregation across repetitions.

During application to one or more different patients and corresponding different scan data, the same learned weights or values are used. The model and values for the learnable parameters are not changed from one patient to the next, at least over a given time (e.g., weeks, months, or years) or given number of uses (e.g., tens or hundreds). These fixed values and corresponding fixed model are applied sequentially and/or by different processors to scan data for different patients. The model may be updated, such as retrained, or replaced but does not learn new values as part of application for a given patient.

The method is performed by the system of FIG. 1 or another system. The medical scanner scans the patient. An image processor reconstructs the image using the machine-trained model and may combine images from the reconstructed images of any repetitions. A display displays the medical image resulting from reconstruction and/or the combination of images across repetitions. Other components may be used, such as a remote server or a workstation performing the reconstruction and/or display.

The method is performed in the order shown or other orders. Additional, different, or fewer acts may be provided. For example, a preset, default, or user input settings are used to configure the scanning prior art act 600. As another example, the image is stored in a memory (e.g., computerized patient medical record) or transmitted over a computer network instead of or in addition to the display of act 630. In yet another example, act 620 is not performed where repetitions are not aggregated.

In act 600, the medical imaging system scans a patient. The scan is guided by a protocol, such as diffusion-weighted, contrast, or turbo-spin-echo protocol. The scanning results in measurements over a series of scans or over a single scan in the imaging protocol. For repetitive scanning, the pulse or scan sequence repetitively scans the same region of the patient, resulting in sets of scan data that may be independently or separately reconstructed to represent that region.

In an MR example, a pulse sequence is created based on the configuration of the MR scanner (e.g., the imaging protocol selected). The pulse sequence is transmitted from coils into the patient. The resulting responses are measured by receiving radio frequency signals at the same or different coils. The scanning results in k-space measurements as the scan data. Scan data for different repetitions is acquired. The scan includes scans for each repetition or over a series of scans. Alternatively, scan data for a single scan of the region of the patient without repetition is acquired.

In act 610, an image processor reconstructs representations of the patient from the scan data. In one embodiment, the processor reconstructs one representation of the patient from the scan data. In another embodiment, the image processor reconstructs a representation for each scan (repetition) of a series of scans acquired following the protocol.

For MR reconstruction, the k-space data is Fourier transformed into scalar values representing different spatial locations, such as spatial locations representing a plane through or volume of a region in the patient. Scalar pixel or voxel values are reconstructed as the MR image. The spatial distribution of measurements in object or image space is formed. This spatial distribution represents the patient.

The reconstruction is performed, at least in part, using a machine-learned model, such as a neural network trained with deep machine learning. The machine-learned model is previously trained, and then used as trained in reconstruction. Fixed values of learned parameters are used for application. In application of the already trained network, the reconstruction process is followed. The machine-learned model is used in the reconstruction, such as using the same model for each repetition. For example, in response to the input of the scan data for a given repetition for a given patient, a patient specific image is reconstructed. The machine-learned model may output the image as pixels, voxels, and/or a display-formatted image in response to the input or be used in another way in the reconstruction. The learned values and network architecture, with any algorithms (e.g., extrapolation and gradient update), determine the output from the input.

The machine-learned model was previously trained based on a loss function where some information in calculating the loss was phase corrected. Various losses or combinations of losses may be used. For example, the model was trained for use for each scan (repetition) of an imaging protocol based on a loss function from a combination of training images from different scans for the imaging protocol. The aggregation loss arrangement of FIG. 3 or 4 may have been used. The images from different repetitions of the protocol for which the network was trained are aggregated. The aggregated image is compared to a ground truth image to determine the loss used in the optimization to find the values of the learnable parameters of the model. The aggregation may be an average (e.g., sum), geometric mean, geometric product, or other combination used by a protocol using repetition. As another example, the loss is for a single repetition without aggregation. In yet another example, the loss is a combination of losses for individual repetitions and an aggregated loss.

The loss included phase correction. The machine-learned model was trained with application of phase correction. In the aggregate or deepset approach, the phase correction was separately calculated for each ground truth image for each of the scans of the imaging protocol. An averaged ground truth was generated from the phase corrected ground truths and applied for a complex-valued loss. Alternatively, or additionally, the phase correction was separately applied to each output of the model being trained, and the complex-valued loss was based on an average of the phase corrected outputs. In one embodiment, the complex-valued loss was based on the average of the phase corrected outputs and the average of the phase corrected ground truths. In the baseline approach, the phase correction was applied just to the output of the model, just to the ground truth representation, or both.

Since the machine-learned model and corresponding reconstruction may be performed on each scan of the given protocol separately or independently, the reconstruction for each scan may be performed while another of the scans is occurring. A scan image for one of the scans of the series of scans in the pulse sequence is reconstructed prior to scanning of another of the scans of the series, such as reconstructing the initial scan during the second scan of the series and prior to the third or later scans of the series.

The output of the reconstruction, such as the output of the machine-learned model, is a two-dimensional distribution of pixels representing an area of the patient and/or a three-dimensional distribution of voxels representing a volume of the patient. The output from the last reconstruction iteration may be used as the output representation or image of the patient for a given repetition.

Other processing may be performed on the input k-space measurements before input. Other processing may be performed on the output representation or reconstruction, such as spatial filtering, color mapping, and/or display formatting. In one embodiment, the machine-learned network outputs voxels or scalar values for a volume spatial distribution as the medical image. Volume rendering is performed to generate a display image. In alternative embodiments, the machine-learned network outputs the display image directly in response to the input.

In act 620, the image processor combines the scan images into a medical image. The scan images from the different scans are combined, such as using the aggregation approach provided by the protocol. For example, the scan images (e.g., pixels or voxels) are averaged or summed as provided by diffusion-weighted or turbo-spin-echo protocols. The result is a medical image of the patient from the scanning for that appointment or examination.

The combination occurs after or before any rendering or reformatting for display. The representation or data derived from the reconstructed representations are combined. For example, voxels are combined prior to rendering. The scan images in the form of voxels representing a volume are combined. The resulting combination is then rendered to a two-dimensional display.

Other operations may be performed before, after, or during the combination. For example, spatial filtering is applied. As another example, the scan images are motion corrected or aligned spatially prior to combination.

In act 630, a display (e.g., display screen or device) displays the medical image, such as the MR image formed by aggregation of scan images. The medical image, after or as part of any post processing, is formatted for display on the display. The display presents the image for viewing by the user, radiologist, physician, clinician, and/or patient. The image assists in diagnosis.

The displayed image may represent a planar region or area in the patient. Alternatively, or additionally, the displayed image is a volume or surface rendering from voxels (three-dimensional distribution) to the two-dimensional display.

Although the subject matter has been described in terms of exemplary embodiments, it is not limited thereto. Rather, the appended claims should be construed broadly, to include other variants and embodiments, which can be made by those skilled in the art.

What is claimed is:

1. A method of machine training for magnetic resonance (MR) reconstruction in medical imaging, the method comprising:
   acquiring MR training data including ground truth representations;
   machine training a neural network for the MR reconstruction using the MR training data, wherein an output of the neural network and/or the ground truth representations are phase corrected;
   extracting a phase map from low pass filtering of the output or one of the ground truth representations, wherein the phase correction multiplies complex values with the phase map; and
   storing the neural network as machine trained.

2. The method of claim 1 wherein acquiring comprises acquiring the MR training data for an MR protocol using multiple repetitions and wherein machine training comprises training the neural network to output an image for each one of the multiple repetitions, a first loss used in the training being based on an aggregation of the images from the multiple repetitions.

3. The method of claim 2 wherein the aggregation is an average in a complex-value domain where the first loss comprises a combination of a complex-value loss and a magnitude-based loss.

4. The method of claim 1 wherein separate ones of the phase maps are separately extracted for each of the outputs or ground truth representations.

5. The method of claim 1 wherein machine training comprises machine training where the phase correction is derived from the MR training data and applied to the output.

6. The method of claim 1 wherein machine training comprises machine training where the phase correction is derived from the output.

7. The method of claim 1 wherein machine training comprises machine training where the phase correction is derived from the MR training data and applied to the ground truth representations.

8. The method of claim 1 wherein machine training comprises applying the phase correction to the output and the ground truth representations.

9. A method of machine training for magnetic resonance (MR) reconstruction in medical imaging, the method comprising:
  acquiring MR training data including ground truth representations for an MR protocol using multiple repetitions;
  machine training a neural network for the MR reconstruction using the MR training data, wherein an output of the neural network and/or the ground truth representations are phase corrected, wherein the machine training comprises training the neural network to output an image for each one of the multiple repetitions, a first loss used in the training being based on an aggregation of the images from the multiple repetitions; and
  storing the neural network as machine trained;
  wherein the phase correction is applied to each of the ground truth representations and the first loss used in the training is based on the aggregation of the images as compared to an aggregation of the ground truth representations for the repetitions, the aggregation of the ground truth representations formed after the phase correction is applied.

10. A method of machine training for magnetic resonance (MR) reconstruction in medical imaging, the method comprising:
  acquiring MR training data including ground truth representations;
  machine training a neural network for the MR reconstruction using the MR training data, wherein an output of the neural network and/or the ground truth representations are phase corrected, wherein the machine training comprises machine training with a complex-value loss based on the phase corrected output and/or ground truth representations and a supervised loss between the output and the ground truth representations without phase correction; and
  storing the neural network as machine trained.

11. A method for reconstruction of a medical image in a medical imaging system, the method comprising:
  scanning, by the medical imaging system, a patient, the scanning resulting in scan data, wherein the scan data comprises measurements over a series of scans of an imaging protocol;
  reconstructing, by an image processor applying a machine-learned model, a scan image, the machine-learned model having been trained with application of phase correction, wherein reconstructing comprises reconstructing the scan image for each of the scans of the series, the machine-learned model having been trained for use for each scan of the imaging protocol based on a loss function from a combination of training images from different scans for the imaging protocol, wherein the phase correction was separately calculated for each ground truth image for each of the scans of the imaging protocol, an averaged ground truth was generated from the phase corrected ground truths and applied for a complex-valued loss;
  combining the scan images into the medical image; and
  displaying the medical image based on the scan image.

12. The method of claim 11 wherein the phase correction was separately applied to each output of the model being trained and wherein the complex-valued loss was based on an average of the phase corrected outputs and the average of the phase corrected ground truths.

13. A system for reconstruction in medical imaging, the system comprising:
  a medical scanner configured to repetitively scan a region of a patient pursuant to a protocol, the scan providing scan data in repetitions of the protocol;
  an image processor configured to reconstruct, for each of the repetitions, a representation of the region, the image processor configured to reconstruct by application of a machine-learned model having been trained for the reconstruction for each of the repetitions based on a loss function between an aggregate of outputs from the repetitions of the protocol and a ground truth, the loss function having been a complex-valued loss based on the output for each of the repetitions and component images of the ground truth being phase corrected, the image processor further configured to combine the representations from the repetitions; and
  a display configured to display an image of the region from the combined representations.

14. The system of claim 13 wherein the machine-learned model was trained with the phase corrections for the outputs having been derived from the component images of the ground truth.

15. The system of claim 14 wherein the machine-learned model was trained with the phase corrections having been derived from the component images by low pass filtering and extraction from results of the low pass filtering.

16. The system of claim 14 wherein the outputs and component images were paired such that the phase correction for each component image is applied to the paired output.

17. The system of claim 13 wherein the ground truth comprised an aggregated ground truth.

* * * * *